United States Patent
Kim et al.

(10) Patent No.: US 9,159,282 B2
(45) Date of Patent: Oct. 13, 2015

(54) DISPLAY DEVICE AND METHOD OF CANCELING OFFSET THEREOF

(71) Applicant: Samsung Electronics Co., Ltd., Suwon-si (KR)

(72) Inventors: Hyungtae Kim, Gyeonggi-do (KR); Jeongah Ahn, Gyeonggi-do (KR); Jihoon Kim, Seoul (KR); Chon-Wook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 139 days.

(21) Appl. No.: 13/624,340

(22) Filed: Sep. 21, 2012

(65) Prior Publication Data

US 2013/0069717 A1  Mar. 21, 2013

(30) Foreign Application Priority Data

Sep. 21, 2011  (KR) .................. 10-2011-0095211

(51) Int. Cl.
*G09G 3/36* (2006.01)

(52) U.S. Cl.
CPC .............. *G09G 3/3614* (2013.01); *G09G 3/36* (2013.01); *G09G 3/3688* (2013.01); *G09G 2300/0871* (2013.01); *G09G 2310/0291* (2013.01); *G09G 2320/0204* (2013.01); *H03F 2200/375* (2013.01)

(58) Field of Classification Search
CPC .............. G09G 3/3614; G09G 2310/0291; G09G 3/36; G09G 3/3688; G09G 2300/0871; G09G 2320/0204; H03F 2200/375

USPC ................................................ 330/9; 327/124
See application file for complete search history.

(56) References Cited

U.S. PATENT DOCUMENTS

| 7,321,261 | B2 | 1/2008 | Felder | |
|---|---|---|---|---|
| 7,852,308 | B2 * | 12/2010 | Kim | 345/100 |
| 7,999,799 | B2 * | 8/2011 | Fukuo | 345/204 |
| 2005/0219189 | A1 | 10/2005 | Fukuo | |
| 2006/0017680 | A1 * | 1/2006 | Chen et al. | 345/96 |
| 2007/0013641 | A1 | 1/2007 | Kim | |
| 2007/0024562 | A1 | 2/2007 | Choi | |
| 2007/0030236 | A1 * | 2/2007 | Kim et al. | 345/98 |
| 2007/0236285 | A1 * | 10/2007 | Felder | 330/9 |
| 2008/0191912 | A1 | 8/2008 | Shin et al. | |
| 2008/0258797 | A1 | 10/2008 | Wright et al. | |
| 2008/0259017 | A1 | 10/2008 | Wright et al. | |
| 2009/0109198 | A1 * | 4/2009 | Kim et al. | 345/204 |
| 2011/0148893 | A1 | 6/2011 | An et al. | |

FOREIGN PATENT DOCUMENTS

| CN | 101059940 A | 10/2007 |
|---|---|---|
| CN | 101286743 A | 10/2008 |

OTHER PUBLICATIONS

Coinciding definition, Merriam Webster, http://www.merriam-webster.com/thesaurus/coinciding.*

* cited by examiner

*Primary Examiner* — Aneeta Yodichkas
*Assistant Examiner* — Brent D Castiaux
(74) *Attorney, Agent, or Firm* — Myers Bigel Sibley & Sajovec, PA (57) ABSTRACT

A method of canceling an offset of display device includes coinciding offset directions of amplifiers with one another and canceling offsets of the amplifiers through a chopping operation.

19 Claims, 13 Drawing Sheets

DISPLAY DEVICE AND METHOD OF CANCELING OFFSET THEREOF

CROSS-REFERENCE TO RELATED APPLICATIONS

This U.S. non-provisional patent application claims priority under 35 U.S.C. §119 of Korean Patent Application No. 10-2011-0095211, filed on Sep. 21, 2011, the entire contents of which are hereby incorporated by reference.

BACKGROUND

The present inventive concept herein relates to display devices and methods of canceling an offset value of an output signal used to drive data lines in the display devices.

A display device has advantages of miniaturization and low power consumption and is used in a notebook computer and a LCD TV. A liquid crystal display device of active matrix type using a thin film transistor as a switch device is suitable for displaying video.

A liquid crystal display device may include a liquid crystal panel, a source driver generating a drive voltage driving many data lines and a gate driver driving many gate lines. As a size of liquid crystal display device becomes large, a size of liquid crystal panel increases. An increase of size of liquid crystal panel causes an increase of the number of data lines to be driven and this leads to an increase of output buffers included in the source driver. To display undistorted video on a liquid crystal panel, it is necessary to cancel an offset value of output signal generated from output buffers.

SUMMARY

Embodiments of the inventive concept provide a method of canceling an offset of display device. The method may include coinciding offset directions of amplifiers with one another; and canceling offsets of the amplifiers through a chopping operation.

Embodiments of the inventive concept also provide a display device. The display device may include a display panel; a source driver that outputs gray scale voltages corresponding to RGB data in response to a horizontal synchronous signal; a gate driver that sequentially outputs the gray scale voltages to the display panel in response to a vertical synchronous signal; and a timing controller that outputs a clock with respect to an inputted frame, the vertical synchronous signal, the horizontal synchronous signal and the RGB data. The source driver comprises a plurality of amplifiers that output the gray scale voltages and cancels offsets of the amplifiers by a chopping operation after coinciding directions of the offsets with one another.

BRIEF DESCRIPTION OF THE FIGURES

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout the description.

DETAILED DESCRIPTION OF THE EMBODIMENTS

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout the description.

It will be understood that when an element or layer is referred to as being "on," "connected to" or "coupled with" another element or layer, it can be directly on, connected or coupled with the other element or layer or intervening elements or layers may be present. In contrast, when an element is referred to as being "directly on," "directly connected to" or "directly coupled with" another element or layer, there are no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1:
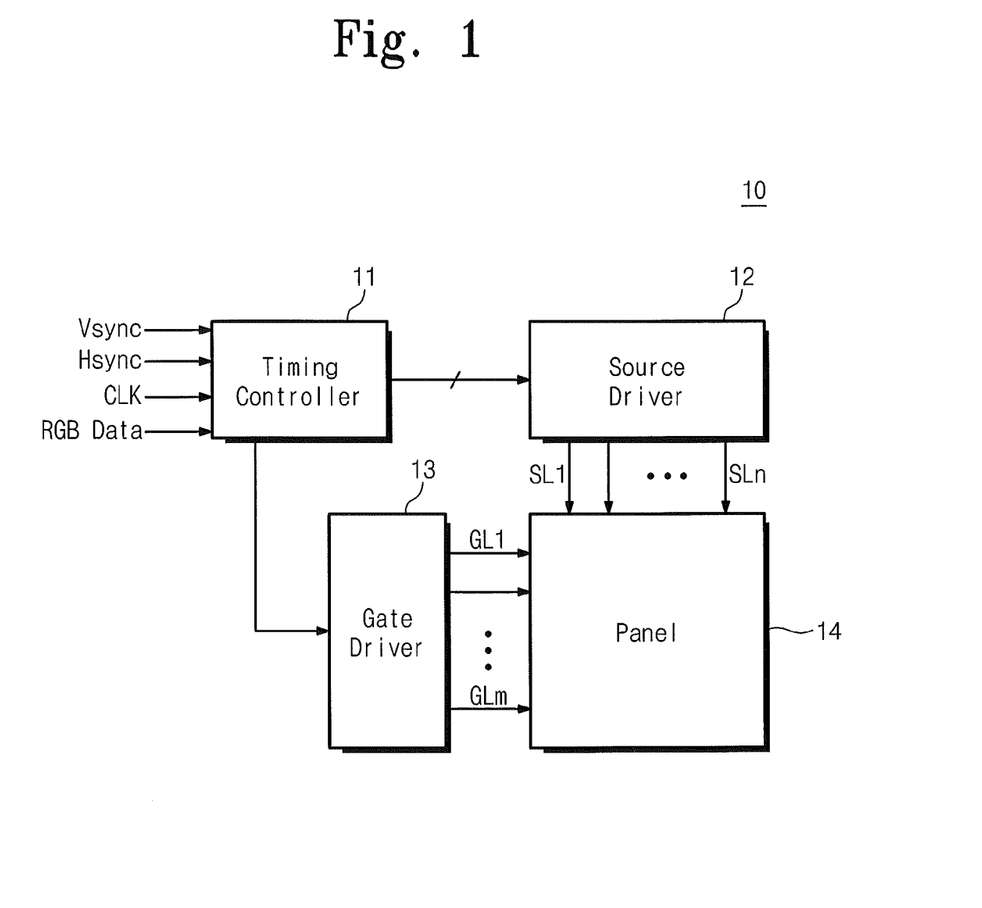
FIG. 1 is a drawing illustrating a display device in accordance with embodiments of the inventive concept.

FIG. 1 is a drawing illustrating a display device in accordance with embodiments of the inventive concept. Referring to FIG. 1, the display device 10 includes a timing controller 11, a source driver 12, a gate driver 13 and a display panel 14.

The timing controller 11 receives a vertical synchronous signal VSYNC, a horizontal synchronous signal HSYNC, a clock CLK and RGB (red, green, blue) data relative to an inputted frame, outputs a horizontal synchronous signal (e.g., HSYNC) to control the source driver 12 and outputs a gate driver control signal (e.g., VSYNC) to control the gate driver 13.

The source driver 12, in response to the RGB data and horizontal synchronous signal HSYNC output from the timing controller 11, outputs gray scale voltages (i.e., output signals) corresponding to the RGB data to the display panel 14 through source lines SL1-SLn. The source driver 12 includes a plurality of amplifiers (not shown) to output the gray scale voltages.

The source driver 12 may be configured to cancel an offset of amplifiers by performing a chopping operation after coinciding offset directions of the amplifiers with one another using an amplifier offset dependant chopping (AODC). The chopping operation may be divided into a first chopping operation alternating a polarity of output signal and a second chopping operation alternating a polarity of offset.

In embodiments, coinciding offset directions of amplifiers with one another means adjusting the offsets of amplifiers so that they are greater than a reference value (e.g., 0V).

In other embodiments, coinciding offset directions of amplifiers with one another means adjusting the offsets of amplifiers so that they are less than a reference value (e.g., 0V).

The gate driver 13 receives a vertical synchronous signal VSYNC output from the timing controller 11 and controls gate lines GL1-GLm to sequentially output analog data outputted from the source driver 12 to the display panel 14.

The display panel 14 includes a plurality of pixels formed at positions where the gate lines GL1-GLm cross the source lines SL1-SLn. For convenience of description, assume that the display panel 14 is a liquid crystal panel.

An operation of the display device is described below. First, the timing controller 11 receives control signals, such as RGB data representing video, a horizontal synchronous signal HSYNC and a vertical synchronous signal VSYNC from a graphic controller (not shown). The gate driver 13 receives a control signal of gate line, such as a vertical synchronous signal VSYNC, and sequentially controls the plurality of gate lines GL1-GLm by sequentially shifting the received vertical synchronous signal VSYNC. The source driver 12 receives RGB data and a control signal of a source driver and outputs a video signal corresponding to one gate line to the display panel 14 when the gate driver 13 controls a gate line.

The general display device may use a matching transistor having a relatively large size to reduce an output voltage deviation of output signal. However, an increase of transistor size causes an increase of the whole chip size. Moreover, as a transistor size increases, there is a limit that a characteristic of output voltage deviation is saturated.

The display device 10, in accordance with embodiments of the inventive concept, performs a chopping operation after coinciding offset directions of amplifiers with one another and thereby an output voltage deviation may be effectively reduced without an increase of chip size.

Figure 2:
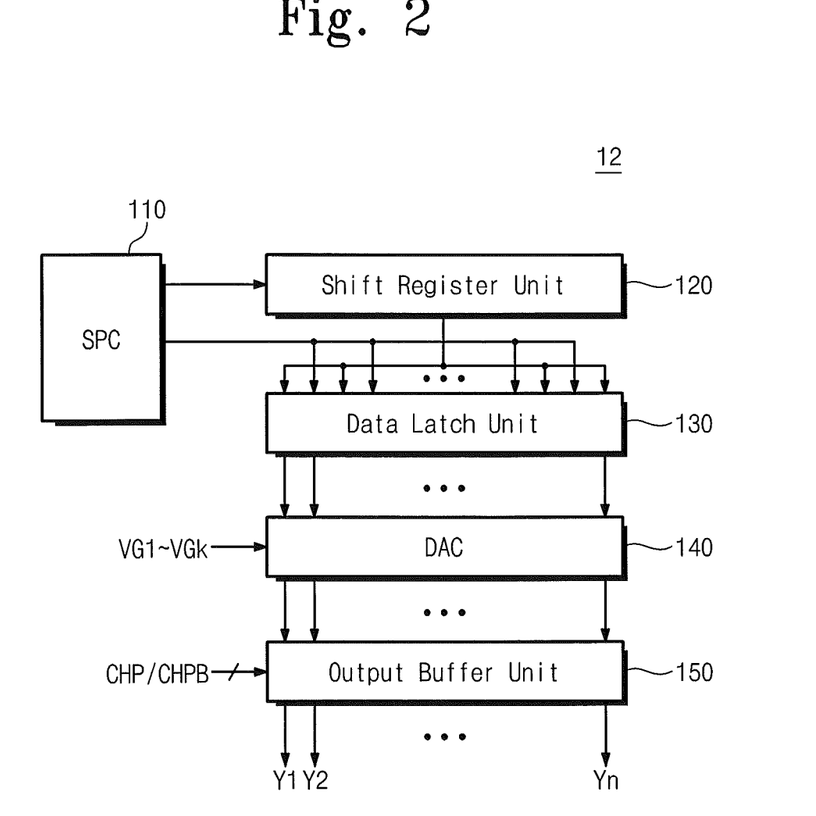
FIG. 2 is a block diagram illustrating source drivers illustrated in FIG. 1.

FIG. 2 is a block diagram illustrating source drivers 12 illustrated in FIG. 1. Referring to FIG. 2, the source driver 12 includes a serial/parallel converter 110, a shift register unit 120, a data latch unit 130, a digital/analog converter 140 and an output buffer unit 150.

The serial/parallel converter 110 receives at least one clock and RGB data by a serialized low voltage differential signaling method and converts it into parallel RGB data.

The shift register unit 120 receives clock signals from the serial/parallel converter 110 to sequentially shift the clock signals. The clock signals may be used to synchronize an output of the shift register unit 120.

The data latch unit 130 includes a plurality of latch circuits (not shown). Each of the latch circuits receives clock signals output from the shift register unit 120 and parallelized RGB data output from the serial/parallel converter 110. That is, the data latch unit 130 stores the parallelized RGB data sequentially from one end of the latch circuit to the other end of the latch circuit on the basis of the shifted clock signals.

The digital/analog converter 140 converts the parallelized RGB data (data corresponding to one gate line) into analog data using a gamma reference voltage VG1-VGk (k is a natural number).

The output buffer unit 150 includes a plurality of output buffers (not shown). Each of the output buffers includes an amplifier that outputs analog data converted in the digital/analog converter 140 to a corresponding pixel on the basis of bias voltages in accordance with an offset cancellation policy. Here, the offset cancellation policy uses a space offset cancellation method or a time offset cancellation method through a chopping operation after coinciding offset directions of amplifiers with one another. The chopping operation may be performed in response to chopping signals (CHP/CHPB).

In some embodiments, the space offset cancellation method may perform a chopping operation relative to an offset polarity at every gate line (or a scanning line).

In some embodiments, the time offset cancellation method may perform a chopping operation relative to an offset polarity by at least one frame unit. The time offset cancellation method performed by a frame unit is described in U.S. Pat. No. 7,852,308 in detail, the disclosure of which is incorporated herein by reference.

In some embodiments, each of the output buffers may have a two channel driving structure. The two channel driving structure is described in U.S. Patent Application Publication No. 2011-0148893 in detail the disclosure of which is incorporated herein by reference.

The source driver 12 performs a chopping operation relative to an offset polarity after coinciding offset directions with one another. Here, the chopping operation relative to an offset polarity may be performed by a time offset cancellation method or a space offset cancellation method.

Figure 3:
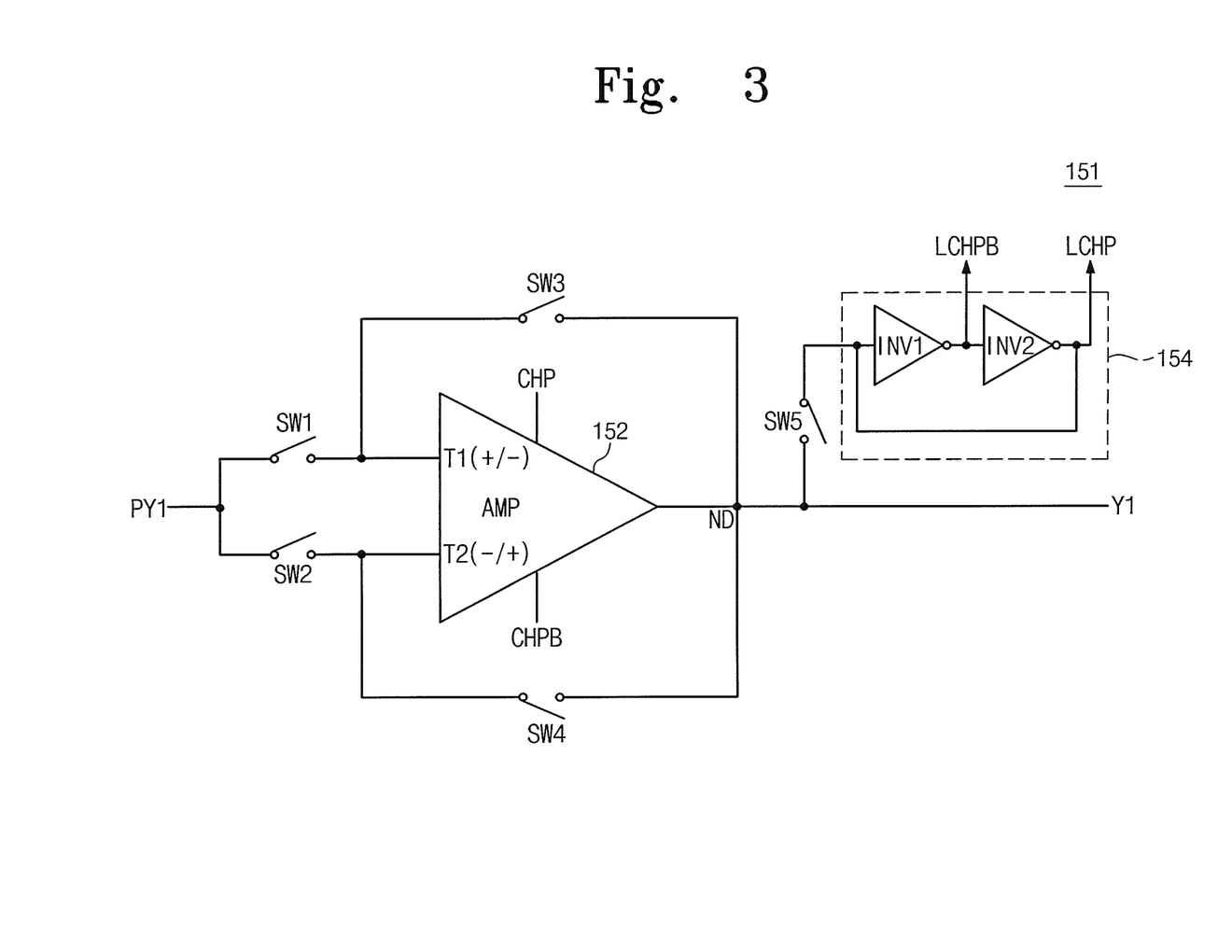
FIG. 3 is a drawing illustrating an output buffer included in any one output buffer unit illustrated in FIG. 2.

FIGS. 3 through 7 are drawings for describing a method of coinciding offset directions with one another. FIG. 3 is a drawing illustrating any one output buffer included in an output buffer unit 150 illustrated in FIG. 2. Referring to FIG. 3, an output buffer 151 includes an amplifier 152, a latch 154 and first through fifth switches SW1-SW5.

The amplifier 152 outputs, a positive/negative voltage Y1 corresponding to analog data PY1 in response to chopping signals CHP/CHPB. Here, the positive voltage is a voltage higher than a common voltage and the negative voltage is a voltage lower than a common voltage.

The amplifier 152 operates in any one of first type and second type according to data LCHP/LCHPB stored in the latch 154 and a turn-on/turn-off operation of the switches SW1-SW5 when performing an amplifier-type setting operation. Here, the amplifier-type setting operation is to set an operation of the amplifier to one of the first type and the second type.

When the amplifier 152 operates in the first type, a first terminal T1 is a positive input terminal (+) and a second terminal T2 is a negative input terminal (−). When the amplifier 152 operates in the second type, a first terminal T1 is a negative input terminal (−) and a second terminal T2 is a positive input terminal (+).

A structure of the amplifier 152 is described in U.S. Pat. No. 7,852,308 in detail the disclosure of which is incorporated herein by reference.

The latch 154 includes a first inverter INV1 and a second inverter INV2. An output of the first inverter INV1 is input to the second inverter INV2 and an output of the second inverter INV2 is input to the first inverter INV1. The latch 154 latches data LCHP/LCHPB corresponding to a voltage of output node ND (i.e., an offset voltage of the amplifier 152) when performing an amplifier-type setting operation. Here, the latched data LCHP/LCHPB may be used as a chopping signal CHP/CHPB when performing an amplifier-type setting operation.

For example, the latch 154 outputs a chopping signal CHP having a supply voltage and an inverted chopping signal CHPB having a ground voltage when a voltage of output node ND is a positive voltage (that is, when an offset of the amplifier 152 is a positive voltage). Also, the latch 154 outputs a chopping signal CHP having a ground voltage and an inverted chopping signal CHPB having a supply voltage when a voltage of output node ND is a negative voltage (that is, when an offset of the amplifier 152 is a negative voltage).

The first switch SW1 performs a switching operation to provide analog data PY1 to the first terminal T1. The second switch SW2 performs a switching operation to provide analog data PY1 to the second terminal T2. The third switch SW3 performs a switching operation to connect the first terminal T1 to the output node ND. The fourth switch SW4 performs a switching operation to connect the second terminal T2 to the output node ND. The fifth switch SW5 performs a switching operation to connect the latch 154 to the output node ND.

The first through fifth switches SW1-SW5 are switches to set a type of the amplifier 152 and the number and arrangement of the first through fifth switches SW1-SW5 illustrated in FIG. 2 are only an illustration. The output buffer in accordance with embodiments of the inventive concept may be embodied by various combinations of switches, an amplifier and a latch to set an operation type of the amplifier 152.

The output buffer 151 may set an operation type of the amplifier 152 according to a voltage of the output node ND of the amplifier 152 when setting an amplifier offset. The output buffer 151 may fit an offset voltage of the amplifier 152 in one direction.

Figure 4:
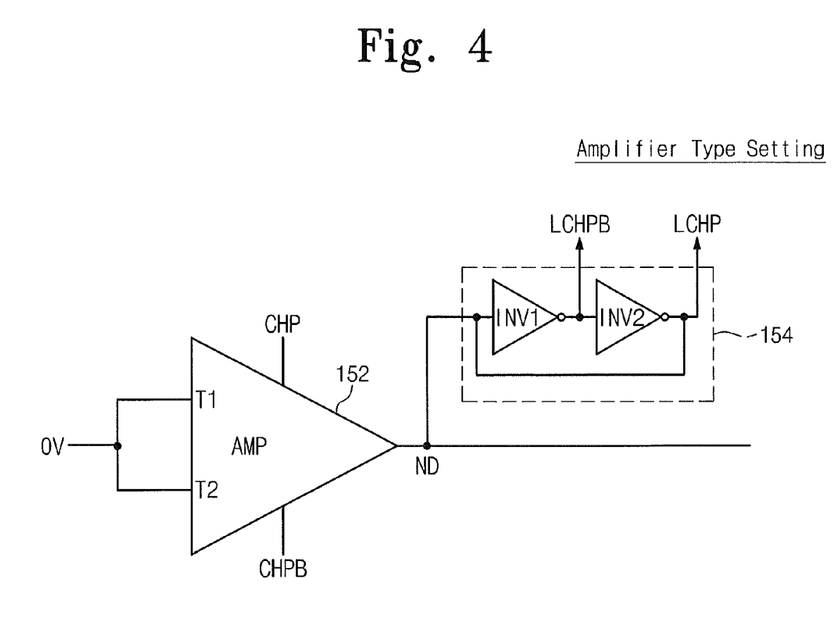
FIG. 4 is a drawing illustrating the output buffer illustrated in FIG. 3 when setting an amplifier type.

FIG. 4 is a drawing illustrating the output buffer 151 illustrated in FIG. 3 when setting an amplifier type. Referring to FIG. 4, when setting an amplifier type, 0V is applied to the first and second terminals T1 and T2 in common and the latch 154 latches data LCHP/LCHPB corresponding to a voltage (offset voltage) of output node ND of the amplifier 152. The data LCHP/LCHPB latched to the latch 154 may be a supply voltage or a ground voltage.

The output buffer 151 determines an amplifier type on the basis of data corresponding to an offset voltage when setting an amplifier type.

Figure 5:
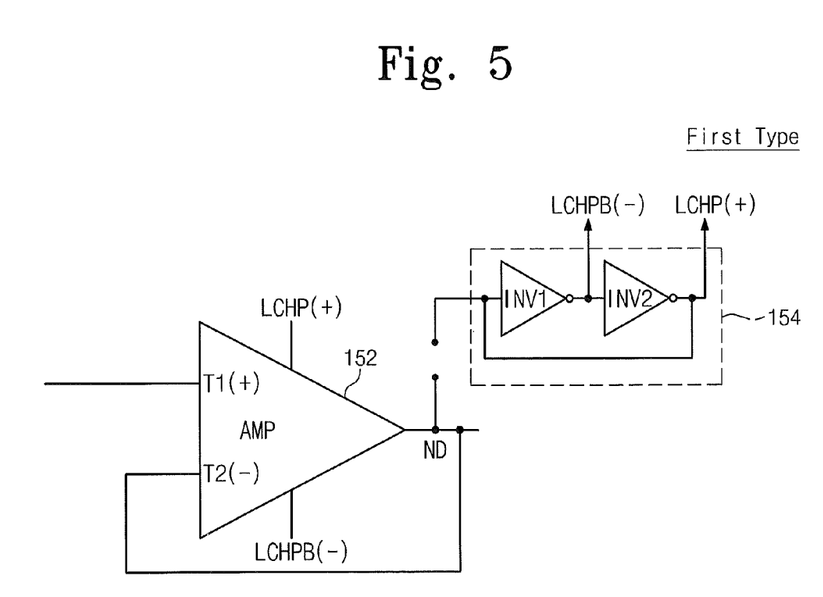
FIG. 5 is a drawing illustrating a first type of amplifier when setting an amplifier type.

FIG. 5 is a drawing illustrating a first type of amplifier 152 when setting an amplifier type. Referring to FIG. 5, a first type of amplifier 152 includes a first terminal T1 receiving analog data PY1 and a second terminal T2 connected to the output node ND. The first terminal T1 is a positive input terminal (+) and the second terminal T2 is a negative input terminal (−).

When setting an amplifier type, the latched data LCHP/LCHPB may be used as a chopping signal CHP/CHPB of the amplifier 152. After setting an amplifier type, the latched data LCHP/LCHPB is not used as a chopping signal CHP/CHPB. The amplifier 152 changes a polarity of an output signal by data LCHP/LCHPB latched when setting an amplifier type and changes a polarity of an output signal by a chopping signal CHP/CHPB after setting an amplifier type.

Figure 6:
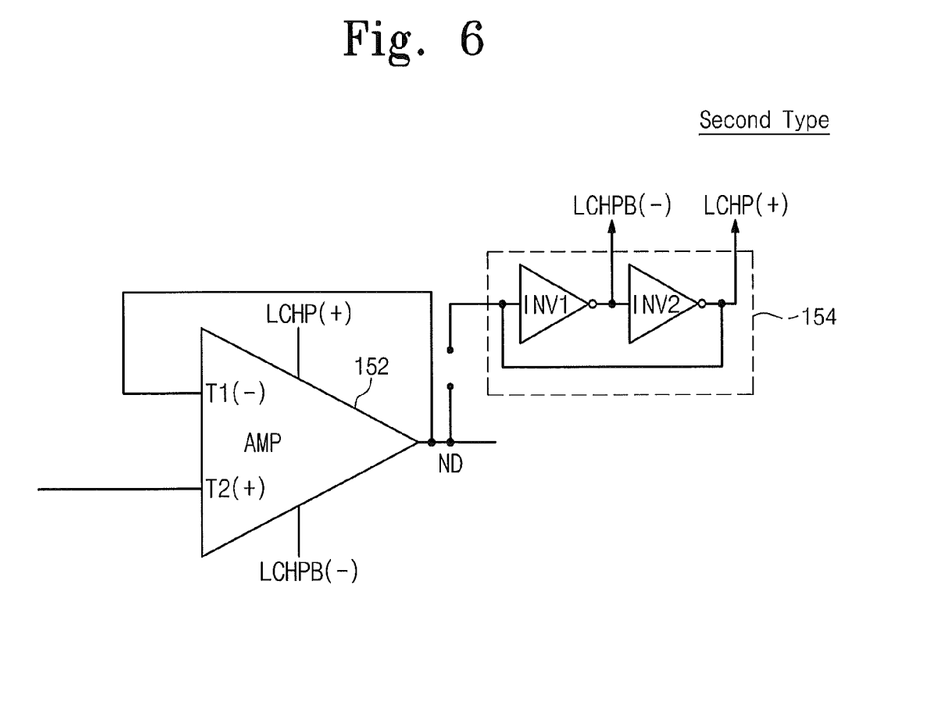
FIG. 6 is a drawing illustrating a second type of amplifier when setting an amplifier type.

FIG. 6 is a drawing illustrating a second type of amplifier 152 when setting an amplifier type. Referring to FIG. 6, a second type of amplifier 152 has a first terminal T1 connected to the output node ND and a second terminal T2 receiving analog data PY1. The first terminal T1 is a negative input terminal (−) and the second terminal T2 is a positive input terminal (+). When setting an amplifier type, the latched data CLHP/LCHPB is used as a chopping signal of the amplifier 152.

Figure 7:
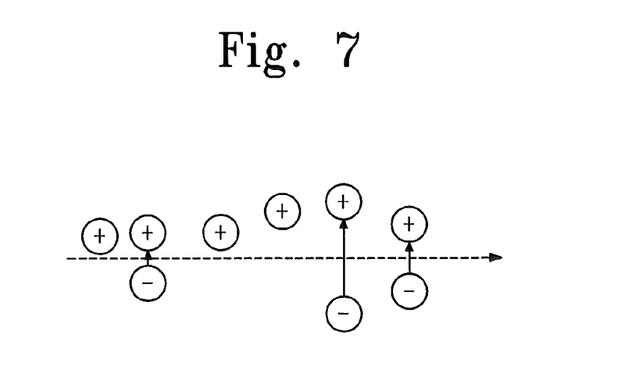
FIG. 7 is a drawing illustrating a result of coinciding offset directions of output buffers in accordance with embodiments of the inventive concept with one another.

FIG. 7 is a drawing illustrating a result of coinciding offset directions of output buffers in accordance with embodiments of the inventive concept with one another. Referring to FIG. 7, through an operation of setting an amplifier type, offsets (negative offsets) lower than a reference value are inverted to offsets (positive offsets) higher than the reference value.

In FIG. 7, offset directions are coincided so that offsets of output buffers are configured to be higher than a reference value but it is not necessary to be limited thereto. In the inventive concept, offset directions may be coincided with one another so that offsets of output buffers are configured to be lower than a reference value.

Figure 8:
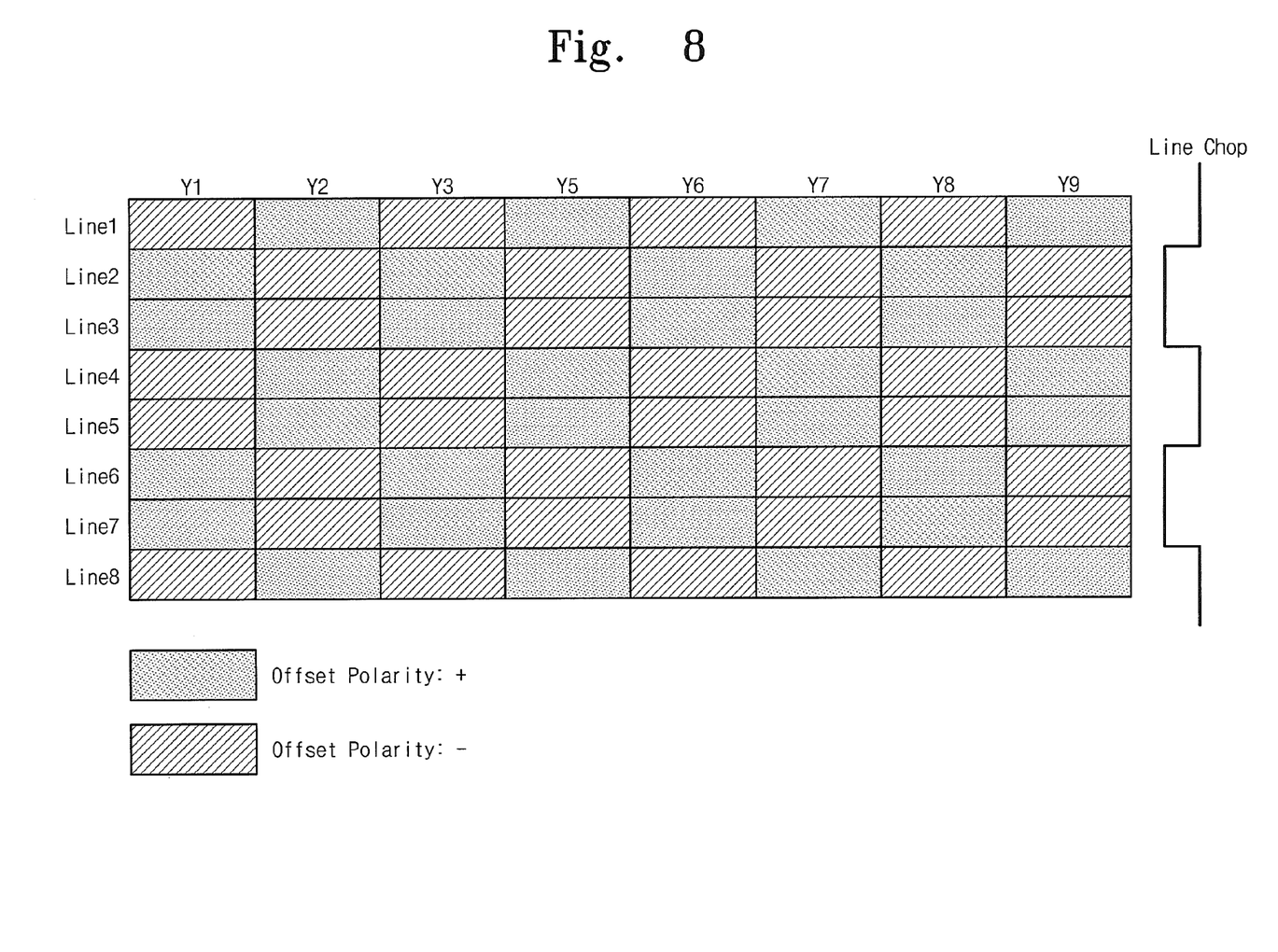
FIG. 8 is a drawing illustrating a method of performing a chopping operation with respect to a polarity of offset on every gate line in accordance with embodiments of the inventive concept.

FIG. 8 is a drawing illustrating a method of performing a chopping operation with respect to a polarity of offset on every gate line in accordance with embodiments of the inventive concept. Referring to FIG. 8, a chopping operation relative to polarity of offset is performed at every two gate lines. Polarity of offset is changed at all the source lines SL1-SL9 corresponding to output signals Y1-Y9.

Figure 9:
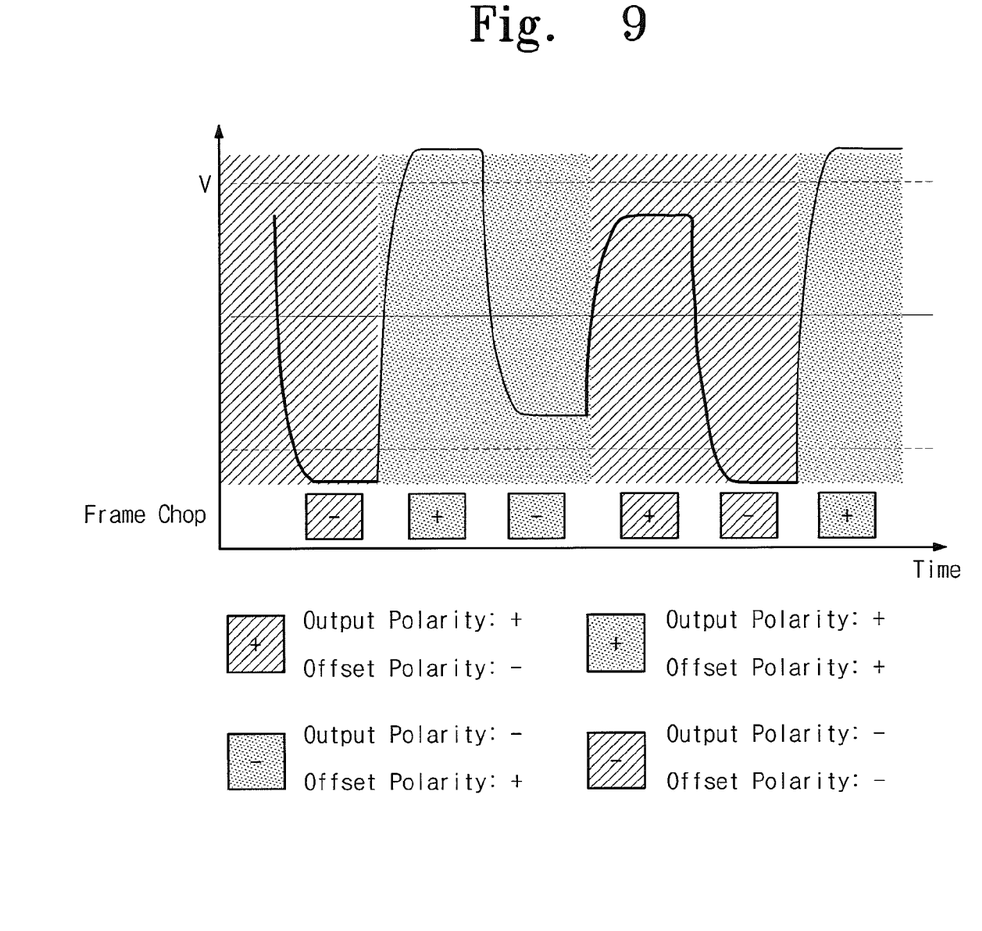
FIG. 9 is a drawing illustrating a method of performing a chopping operation by a frame unit in accordance with embodiments of the inventive concept.

FIG. 9 is a drawing illustrating a method of performing a chopping operation by a frame unit in accordance with embodiments of the inventive concept. Referring to FIG. 9, a chopping operation relative to a polarity offset is performed by one frame unit. Also, a chopping operation relative to a polarity of output signal is performed by one frame unit.

Figure 10:
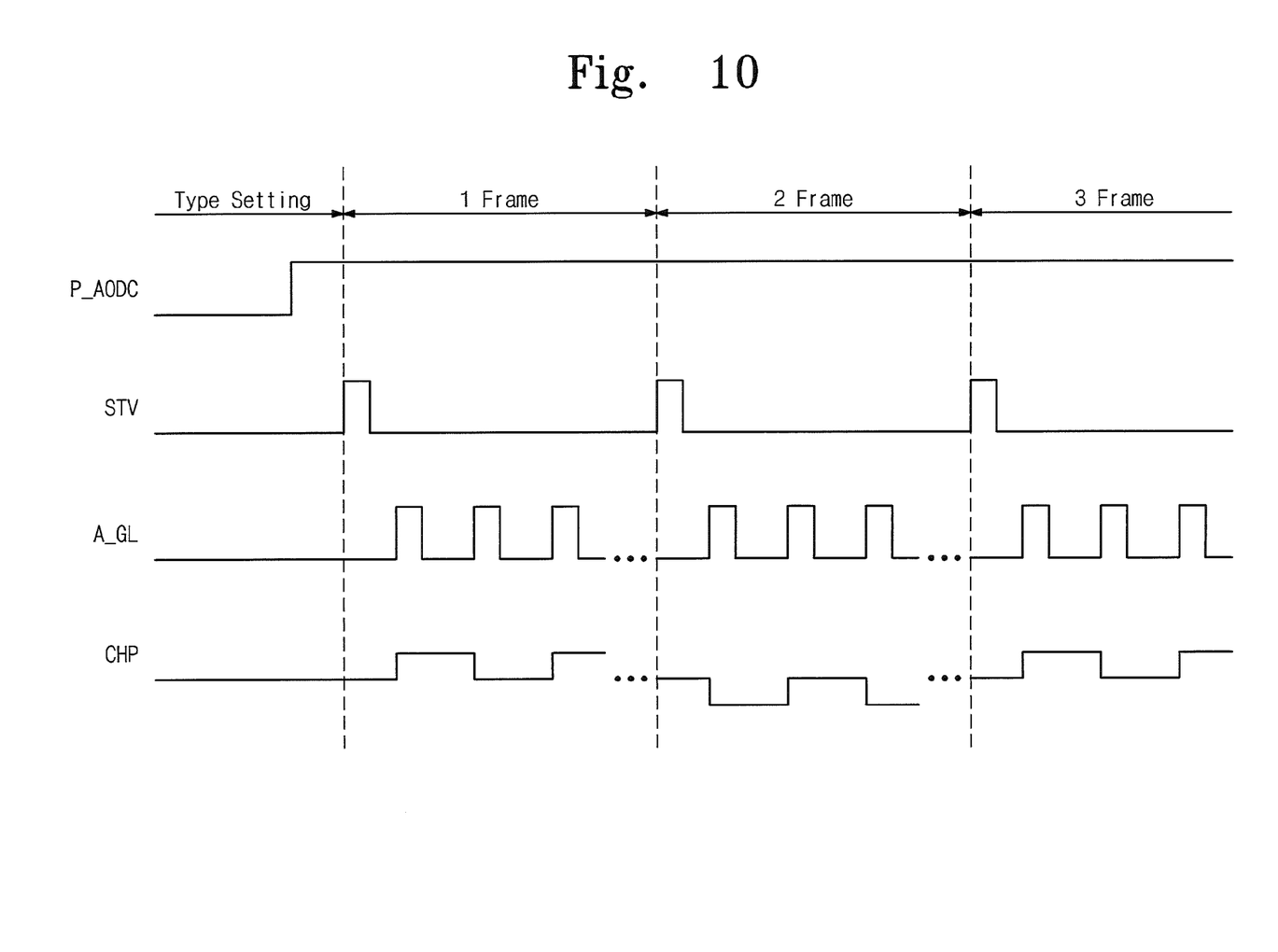
FIG. 10 is a timing diagram illustrating a method of canceling an offset of display device in accordance with embodiments of the inventive concept.

FIG. 10 is a timing diagram illustrating a method of canceling an offset of a display device 10 in accordance with embodiments of the inventive concept. Referring to FIGS. 1 through 10, a method of canceling offset is as follows: When a phase signal (P_AODC) of the amplifier 152 is at low level, an amplifier-type setting operation is performed. The switches SW1-SW5 are properly turned off in response to the phase signal (P_AODC) of the amplifier 152 having a low level to constitute the output buffer 151 illustrated in FIG. 3. A type of amplifier 152 is determined by a voltage (offset voltage) at the output node ND. After a type of the amplifier 152 is determined, the phase signal (P_AODC) of the amplifier 152 has a high level. In this manner, a type of each amplifier of all the output buffers of the output buffer unit 150 is determined. Thus, offset directions of the output buffers may coincide with one another.

After that, a plurality of gate line activation signals (A_GL) is sequentially input in response to a frame input signal (STV) at a high level. At this time, a chopping signal CHP is output in response to each of the gate line activation signals (A_GL). Thus, a chopping operation relative to a polarity of offset is performed on every gate line.

An offset polarity of the chopping signal CHP is changed by a frame unit. A chopping operation relative to an offset polarity is performed by one frame unit.

In an offset cancellation method in accordance with embodiments of the inventive concept, after coinciding offset directions of output buffers with one another, a chopping operation relative to an offset polarity is performed by one frame unit at every one line.

Figure 11:
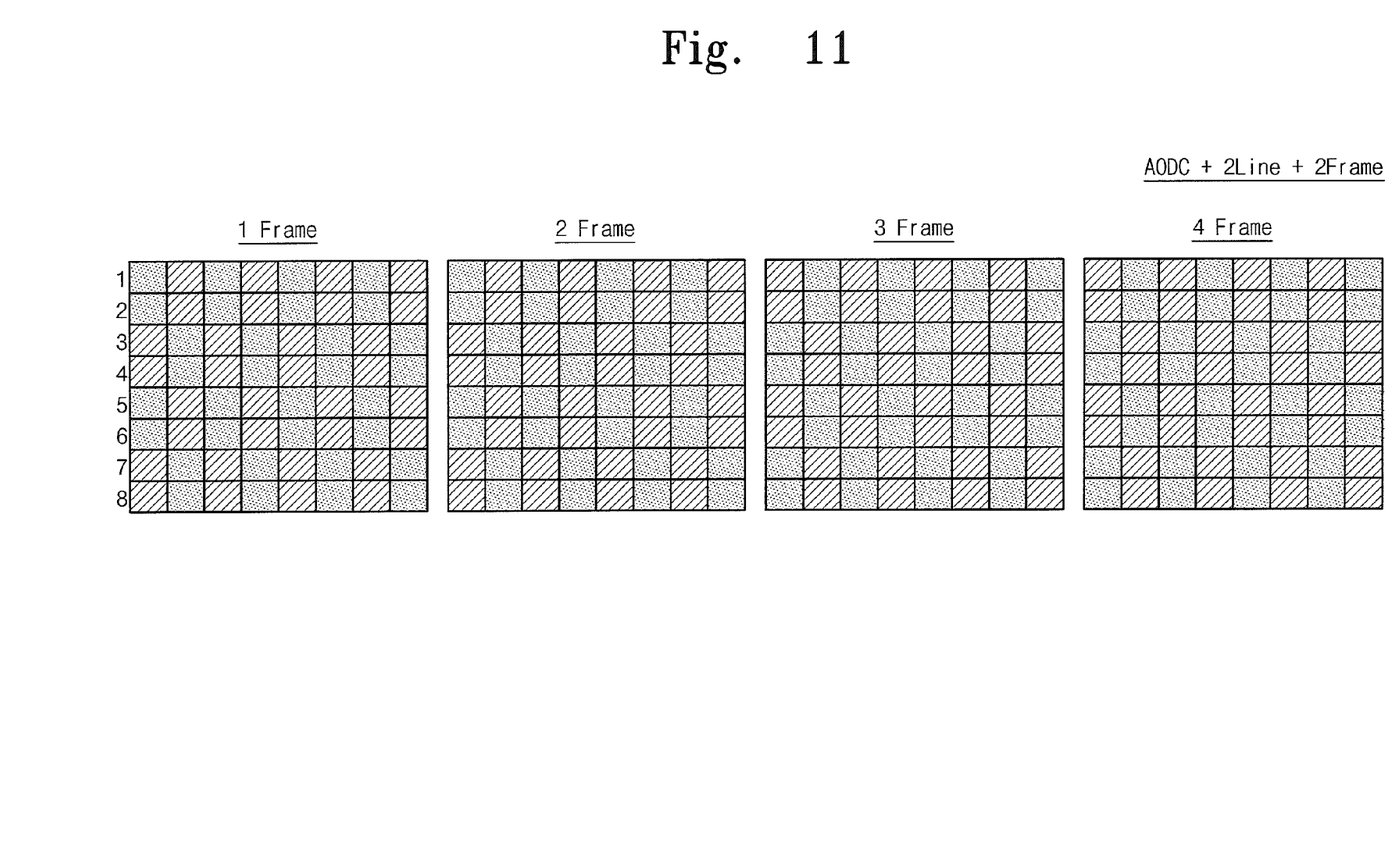
FIG. 11 is a drawing illustrating a method of canceling an offset by two frame units at every two gate lines after coinciding offset directions with one another.
Figure 12:
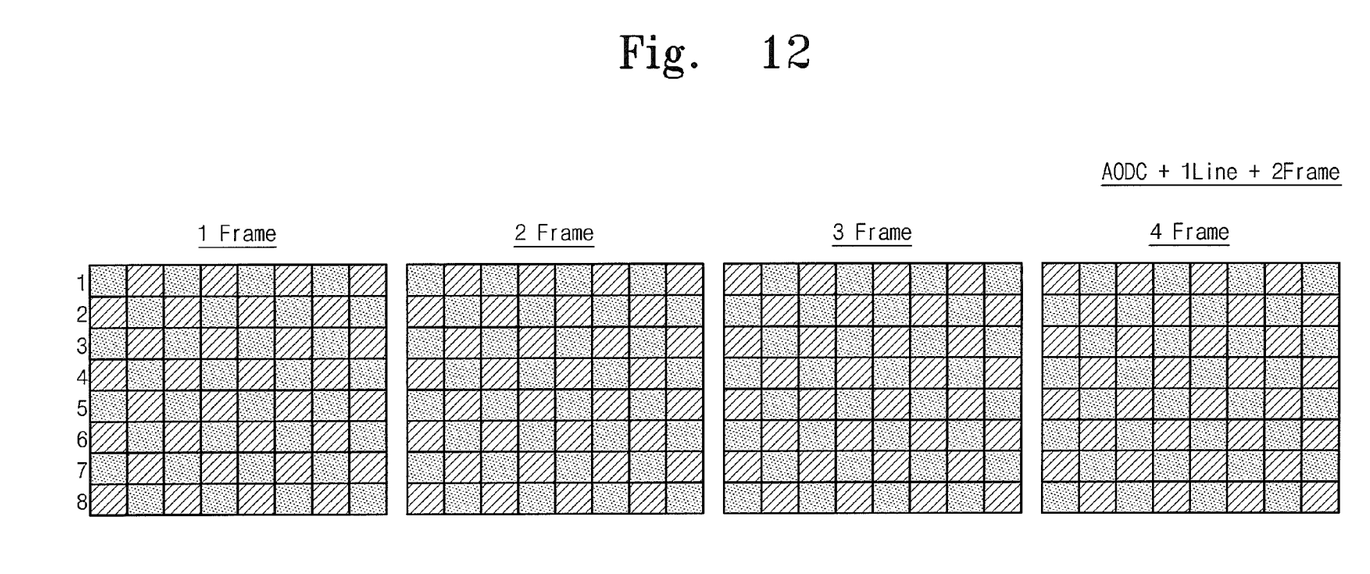
FIG. 12 is a drawing illustrating a method of canceling an offset by two frame units at every one gate line after coinciding offset directions with one another.
Figure 13:
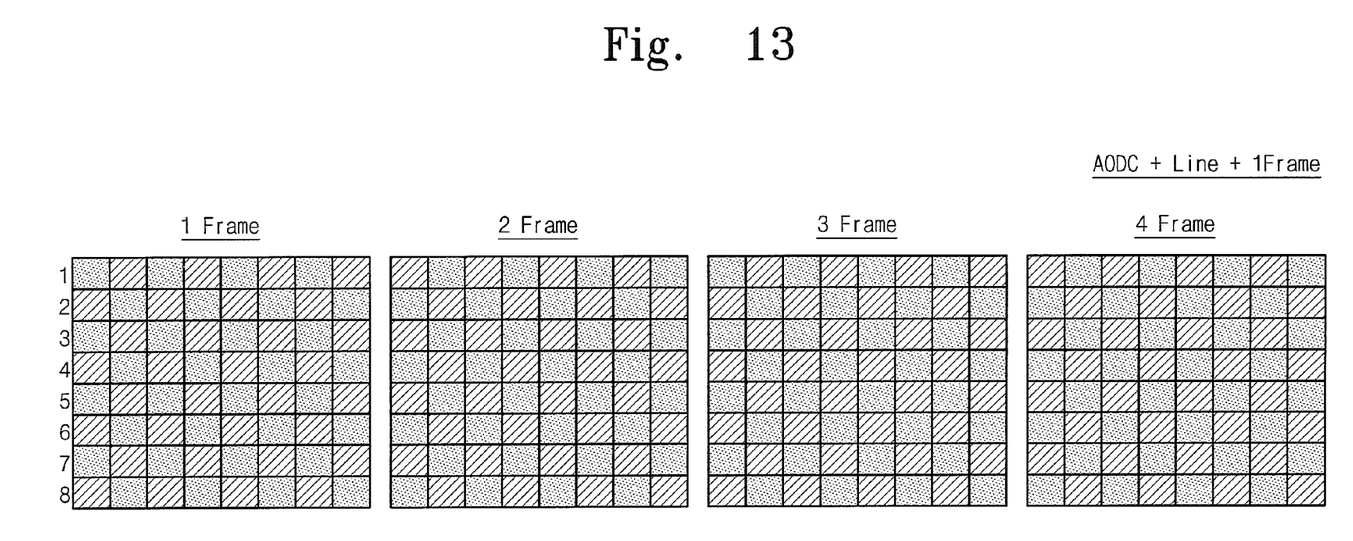
FIG. 13 is a drawing illustrating a method of canceling an offset by one frame unit at every one gate line after coinciding offset directions with one another.

FIGS. 11 through 13 are drawings illustrating various embodiments of offset cancellation method of the inventive concept.

FIG. 11 is a drawing illustrating a method of canceling an offset by two frame units at every two gate lines after coinciding offset directions with one another. Referring to FIG. 11, an offset polarity is changed by two frames at every two gate lines.

FIG. 12 is a drawing illustrating a method of canceling an offset by two frame units at every one gate line after coinciding offset directions with one another. Referring to FIG. 12, an offset polarity is changed by two frames at every one gate line.

FIG. 13 is a drawing illustrating a method of canceling an offset by one frame unit at every one gate line after coinciding offset directions with one another. Referring to FIG. 13, an offset polarity is changed at every one gate line and every one frame.

As described above, in an offset cancellation method of the inventive concept, after coinciding offset directions of the amplifier with one another, an offset polarity is changed at every one or more gate lines, or one or more frame units.

Figure 14:
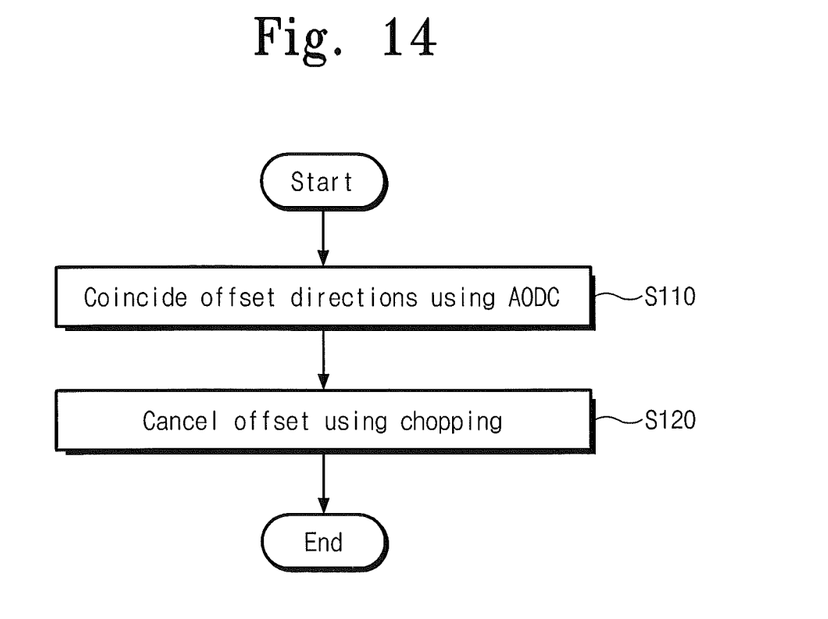
FIG. 14 is a flow chart showing a method of canceling an offset of display device in accordance with embodiments of the inventive concept.

FIG. 14 is a flow chart showing a method of canceling an offset of a display device in accordance with embodiments of the inventive concept. Referring to FIGS. 1 and 14, a method of canceling an offset of display device is as follows:

A DC offset is canceled (S110) by coinciding offset directions of an amplifier through an amplifier-type setting operation and then performing a chopping operation (i.e., amplifier offset dependant chopping (AODC)).

In the amplifiers where an amplifier type is set, offsets of the amplifiers are removed (S120) by performing a chopping operation relative to an offset polarity at one or more gate lines and by one or more frame units.

In an offset cancellation method using a source driver in accordance with embodiments of the inventive concept, an offset may be effectively canceled by coinciding offset directions of output buffers with one another and then performing a chopping operation relative to an offset polarity at every one or more gate lines and by one or more frame units.

Figure 15:
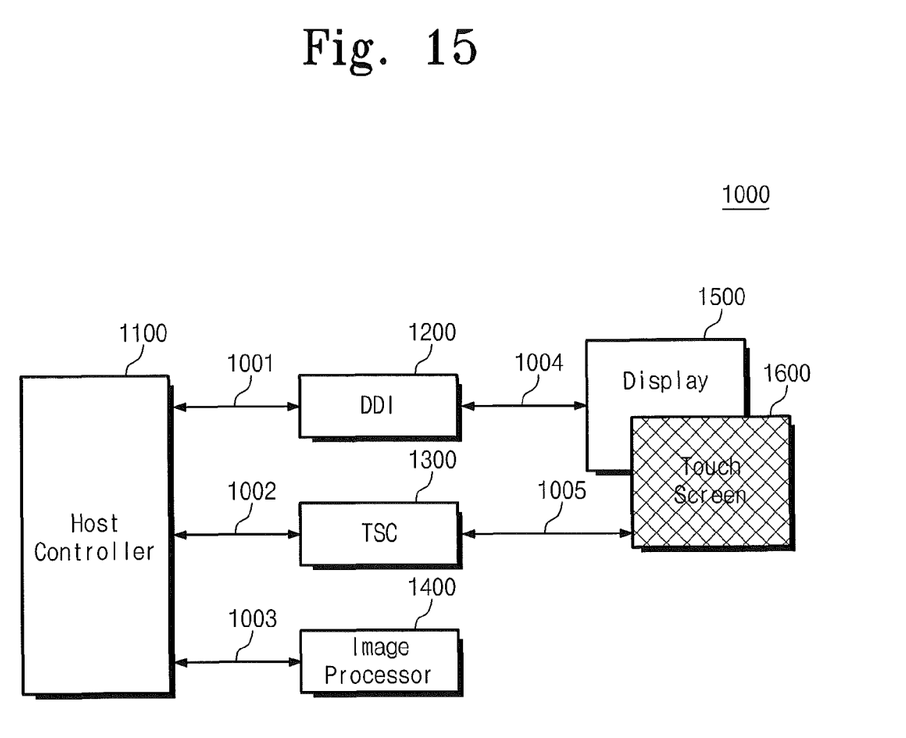
FIG. 15 is a block diagram illustrating a data processing system in accordance with embodiments of the inventive concept.

FIG. 15 is a block diagram illustrating a data processing system 1000 in accordance with embodiments of the inventive concept. Referring to FIG. 15, a data processing system 1000 includes a host controller 1100, a display driver integrated circuit 1200, a touch screen controller 1300 and an image processor 1400. In the data processing system 1000, the display driver integrated circuit 1200 is configured to provide display data 1004 to a display 1500 and the touch screen controller 1300 is configured to be connected to a touch panel 1600 overlapping with the display 1500 and receive sensing data 1005 from the touch panel 1600. The display driver integrated circuit 1200 in accordance with some embodiments of the inventive concept may include the source driver 12 illustrated in FIG. 1.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of canceling an offset in a display device comprising:

coinciding offset directions of amplifiers through an amplifier-type setting operation, wherein the amplifier-type setting operation is to set an operation of respective ones of the amplifiers to one of a first type and a second type; and canceling offsets of the amplifiers through a chopping operation;

wherein the chopping operation comprises a first chopping operation with respect to polarity of an output signal of each of the amplifiers and a second chopping operation with respect to an offset polarity of each of the amplifiers, the amplifier-type setting operation of the respective amplifiers comprises:

applying 0V to a first terminal and a second terminal of the respective amplifiers;

latching offset data corresponding to a voltage of an output node of the respective amplifiers;

wherein the offset data is used as a chopping signal of the respective amplifiers in the amplifier type setting operation, wherein the first type of the respective amplifiers includes the first terminal receiving analog data and the second terminal connected to the output node, wherein the second type of the respective amplifiers includes the second terminal receiving the analog data and the first terminal connected to the output node, wherein the first terminal is a positive input terminal and the second terminal is a negative input terminal for the first type, and wherein the first terminal is a negative input terminal and the second terminal is a positive input terminal for the second type.

2. The method of claim 1, wherein coinciding offset directions of amplifiers comprises making the offsets of the amplifiers be smaller than a reference value.

3. The method of claim 1, wherein coinciding offset directions of amplifiers comprises making the offsets of the amplifiers be greater than a reference value.

4. The method of claim 1, wherein coinciding offset directions of amplifiers comprises:
inputting a reference voltage into first and second terminals of each of the amplifiers;
latching data corresponding to a voltage at an output terminal of each of the amplifiers; and
setting a type of each of the amplifiers by determining the first and second terminals as a positive input terminal and a negative input terminal respectively in response to the latched data.

5. The method of claim 1, wherein the second chopping operation changes the offset polarity at least one gate line.

6. The method of claim 5, wherein the second chopping operation changes the offset polarity at every source line corresponding to the output signal.

7. The method of claim 1, wherein the first chopping operation changes the polarity of the output signal by a frame unit.

8. The method of claim 7, wherein the second chopping operation changes the offset polarity by the frame unit.

9. The method of claim 1, wherein the second chopping operation changes the offset polarity at every one or more gate lines and changes the offset polarity by at least one frame unit.

10. The method of claim 9, wherein the second chopping operation changes the offset polarity at every two gate lines and changes the offset polarity by two frame units.

11. The method of claim 9, wherein the second chopping operation changes the offset polarity at every one gate line and changes the offset polarity by two frame units.

12. The method of claim 9, wherein the second chopping operation changes the offset polarity at every one gate line and changes the offset polarity by one frame unit.

13. A display device, comprising:
a display panel;
a source driver configured to output gray scale voltages corresponding to RGB data to the display panel in response to a horizontal synchronous signal;
a gate driver configured to sequentially output the gray scale voltages to the display panel in response to a vertical synchronous signal; and
a timing controller configured to output a clock with respect to an inputted frame, the vertical synchronous signal, the horizontal synchronous signal and the RGB data,
wherein the source driver comprises a plurality of amplifiers that output the gray scale voltages and cancels offsets of the amplifiers by a chopping operation after coinciding directions of the offsets through an amplifier-type setting operation, wherein the amplifier-type setting operation is to set an operation of respective ones of the amplifiers to one of a first type and a second type; and
wherein the chopping operation comprises a first chopping operation with respect to polarity of an output signal of each of the amplifiers and a second chopping operation with respect to an offset polarity of each of the amplifiers,
the amplifier-type setting operation of the respective amplifiers comprises:
applying 0V to a first terminal and a second terminal of the respective amplifiers;
latching offset data corresponding to a voltage of an output node of the respective amplifiers;
wherein the offset data is used as a chopping signal of the respective amplifiers in the amplifier type setting operation,
wherein the first type of the respective amplifiers includes the first terminal receiving analog data and the second terminal connected to the output node,
wherein the second type of the respective amplifiers includes the second terminal receiving the analog data and the first terminal connected to the output node,
wherein the first terminal is a positive input terminal and the second terminal is a negative input terminal for the first type, and
wherein the first terminal is a negative input terminal and the second terminal is a positive input terminal for the second type.

14. The display device of claim 13, wherein the source driver comprises:
a serial/parallel converter configured to convert the clock and the RGB data into paralleled RGB data;
a shift register unit configured to sequentially shift the clock and to store the shifted clock signals;
a data latch unit configured to store the paralleled RGB data in response to the shifted clock signals;
a digital/analog converter configured to convert the paralleled RGB data stored in the data latch unit into analog data using gamma reference voltages; and
a plurality of output buffers configured to output the converted analog data to a corresponding pixel of the display panel,
wherein each of the output buffers comprises a corresponding amplifier among the plurality of amplifiers
wherein the converted analog data output from the output buffers comprises the gray scale voltages.

15. A display device, comprising:
a display panel;
a source driver configured to output gray scale voltages corresponding to RGB data in response to a horizontal synchronous signal, the source driver comprising a plurality of amplifiers;
wherein the source driver is operable to coincide offset directions of the amplifiers with one another relative to a reference value through an amplifier-type setting operation, wherein the amplifier-type setting operation is to set an operation of respective ones of the amplifiers to one of a first type and a second type; and
wherein the source driver is further operable to cancel an offset associated with the plurality of amplifiers by performing a first chopping operation with respect to polarity of an output signal of each of the amplifiers and a second chopping operation with respect to an offset polarity of each of the amplifiers,
the amplifier-type setting operation of the respective amplifiers comprises:
applying 0V to a first terminal and a second terminal of the respective amplifiers;
latching offset data corresponding to a voltage of an output node of the respective amplifiers;
wherein the offset data is used as a chopping signal of the respective amplifiers in the amplifier type setting operation,
wherein the first type of the respective amplifiers includes the first terminal receiving analog data and the second terminal connected to the output node, wherein the second type of the respective amplifiers includes the second terminal receiving the analog data and the first terminal connected to the output node, wherein the first terminal is a positive input terminal and the second terminal is a negative input terminal for the first type, and wherein the first terminal is a negative input terminal and the second terminal is a positive input terminal for the second type.

16. The display device of claim 15,
wherein the display panel includes a plurality of gate lines and wherein the chopping operation is performed for every gate line.

17. The display device of claim 15, wherein the chopping operation is performed for at least one frame unit.

18. The display device of claim 15, wherein coinciding offset directions of the offset amplifiers with one another comprises making the offsets of the amplifiers greater than the reference value.

19. The display device of claim 15, wherein coinciding offset directions of the offset amplifiers with one another comprises making the offsets of the amplifiers less than the reference value.

* * * * *